United States Patent
Daval et al.

(10) Patent No.: US 7,078,353 B2
(45) Date of Patent: Jul. 18, 2006

(54) INDIRECT BONDING WITH DISAPPEARANCE OF BONDING LAYER

(75) Inventors: Nicolas Daval, Grenoble (FR); Bruno Ghyselen, Seyssinet-Pariset (FR); Cécile Aulnette, Grenoble (FR); Oliver Rayssac, Grenoble (FR); Ian Cayrefourcq, St. Nazire les Eymes (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/753,173

(22) Filed: Jan. 6, 2004

(65) Prior Publication Data

US 2005/0070078 A1    Mar. 31, 2005

(30) Foreign Application Priority Data

Sep. 30, 2003   (FR) .................................. 0311418

(51) Int. Cl.
*H01L 21/31*   (2006.01)
*H01L 21/8222*  (2006.01)
*H01L 21/326*   (2006.01)
*H01L 21/331*   (2006.01)

(52) U.S. Cl. .................. 438/763; 438/311; 438/341; 438/478; 438/481; 438/607; 438/933; 257/779; 257/780

(58) Field of Classification Search ............ 438/763, 438/479, 311, 341, 478, 481, 607, 933; 257/779, 257/780
See application file for complete search history.

(56) References Cited

U.S. PATENT DOCUMENTS

| 6,573,126 | B1 * | 6/2003 | Cheng et al. ............... 438/149 |
|---|---|---|---|
| 6,703,144 | B1 * | 3/2004 | Fitzgerald .................... 428/641 |
| 6,713,326 | B1 * | 3/2004 | Cheng et al. ................ 438/149 |
| 6,723,541 | B1 * | 4/2004 | Sugii et al. .................. 435/166 |
| 6,724,008 | B1 * | 4/2004 | Fitzergald ..................... 257/19 |
| 6,737,670 | B1 * | 5/2004 | Cheng et al. .................. 257/19 |
| 6,746,902 | B1 * | 6/2004 | Maa et al. .................... 438/149 |
| 6,780,796 | B1 * | 8/2004 | Maa et al. .................... 438/795 |
| 6,793,731 | B1 * | 9/2004 | Hsu et al. ....................... 117/3 |

(Continued)

FOREIGN PATENT DOCUMENTS

EP       0 371 862 A2    6/1990

(Continued)

OTHER PUBLICATIONS

T.A. Langdo et al., "Preparation of Novel SiGe-Free Strained Si on Insulator Substrates", 2002 IEEE International SOI Conference, pp. 211-212 (2002).

(Continued)

*Primary Examiner*—Long Pham
*Assistant Examiner*—Shrinivas H. Rao
(74) *Attorney, Agent, or Firm*—Winston & Strawn LLP

(57) ABSTRACT

The invention provides a method of producing a structure of a thin layer of semiconductor material on a support substrate. The thin layer is obtained from a donor substrate and includes an upper layer of semiconductor material. The method includes forming on the upper layer a bonding layer of a material that accepts diffusion from an element of the material of the upper layer, bonding the donor substrate from the side on which the bonding layer is formed on the upper layer to the support substrate, and diffusing the element from the upper layer into the bonding layer to homogenize the concentration of the element in the bonding layer and the upper layer. The result is that the thin layer of the structure is joined by the bonding layer to the upper layer.

21 Claims, 3 Drawing Sheets

U.S. PATENT DOCUMENTS

| | | | |
|---|---|---|---|
| 6,841,457 B1* | 1/2005 | Bedell et al. | 438/479 |
| 2001/0003269 A1 | 6/2001 | WU et al. | 117/94 |
| 2002/0014692 A1 | 2/2002 | Yamada et al. | 257/712 |
| 2002/0030227 A1 | 3/2002 | Bulsara et al. | 257/346 |
| 2002/0146892 A1 | 10/2002 | Notsu et al. | 438/455 |
| 2003/0013305 A1 | 1/2003 | Sugii et al. | 438/689 |
| 2003/0155568 A1* | 8/2003 | Cheng et al. | 257/12 |
| 2003/0168654 A1* | 9/2003 | Cheng et al. | 257/19 |
| 2004/0192067 A1* | 9/2004 | Ghyselen et al. | 438/763 |
| 2005/0009288 A1* | 1/2005 | Cheng et al. | 438/407 |

FOREIGN PATENT DOCUMENTS

| | | |
|---|---|---|
| EP | 1 248 294 A2 | 10/2002 |
| WO | WO 99/53539 | 10/1999 |
| WO | WO 01/54202 A1 | 7/2001 |
| WO | WO 02/33746 A1 | 4/2002 |

OTHER PUBLICATIONS

J.P. Collinge, :"Silicon-on-insulator technology", Materials to VLSI, 2nd Edition, Kluwer Academic Publisher, pp. 50-51.

T.A. Langdo et al., "SiGe-free strained Si on insulator by wafer bonding and layer transfer" Applied Physics Letters, vol. 82, No. 24, pp. 4256-4528 (2003).

* cited by examiner

INDIRECT BONDING WITH DISAPPEARANCE OF BONDING LAYER

FIELD OF THE INVENTION

The present invention relates to methods of producing semiconductor on insulator (SOI) structures which serve as substrates for electronic, optic, and optoelectronic components, devices or applications. Particularly, the present invention is directed to methods for bonding layers of semiconductor material to provide such structures.

BACKGROUND OF THE INVENTION

In producing semiconductor on insulator structures, it is difficult to achieve direct bonding of certain semiconductor materials to a layer (for example an oxide layer). This difficulty is observed in particular when, in order to produce a silicon-germanium on insulator (SGOI) structure, a layer of silicon-germanium (SiGe) is to be bonded directly to a layer of oxide on the surface of a support substrate. This difficulty is all the more pronounced when the concentration of germanium in the SiGe layer is high.

In order to carry out direct bonding of a SiGe layer to a support substrate, methods have been proposed for treating the surfaces to be bonded prior to bonding. For example, in "SiGe-free strained silicon in insulator by wafer bonding and layer transfer", Applied Physics Letters, vol 82 number 24, Jun. 16, 2003, T. A. Langdo et al. disclose bonding a layer of strained silicon on a layer of thermal oxide. Additionally, a method known as "hydrophobic bonding" may be employed, in which the surfaces to be bonded are prepared prior to bonding in order to render them hydrophobic (for example by immersing them in an HF chemical cleaning bath). However, this preparation method tends to cause severe particulate contamination of the surfaces, which can result in generating defects during bonding. A hydrophilic bonding method has also been proposed in which the surface of the SiGe layer to be bonded is treated to render it hydrophilic prior to bringing it into contact either with a hydrophilic silicon surface or with a surface of silicon oxide SiO2.

One of the best known treatments for rendering a layer hydrophilic consists in immersing the layer in a chemical SC1 type solution ($NH_4OH/H_2O_2/H_2O$). However, this solution etches the SiGe layer and tends to increase its roughness, resulting in a bond of unsatisfactory quality. Moreover, the etching rate varies exponentially as a function of the concentration of germanium in a SiGe layer. For this reason, although controlled etching in a SiGe layer having a low concentration of germanium (e.g. 20%) is possible (and thus bonding may be envisaged), controlled etching in a SiGe layer having a high concentration of germanium (e.g. 50%) is difficult. Finally, while hydrophilic bonding of a SiGe layer having a low concentration of germanium (for example 20%) may be carried out in a relatively satisfactory manner, hydrophilic bonding of a SiGe layer having a high concentration of germanium (for example 50%) cannot be achieved.

Known surface treatment methods for directly bonding an SiGe layer to a support substrate of silicon or $SiO_2$ can result in bonding quality that is generally insufficient to meet certain durability specifications in certain fields of application. Good quality bonding is even more difficult to achieve when the germanium concentration in the SiGe layer to be transferred is high. Moreover, the above-mentioned disadvantages of direct bonding of a SiGe layer may also be encountered in the context of direct bonding of layers produced in other materials.

Indirect bonding can also be employed to form a sufficient bond. The term "indirect bonding" means bonding employing a bonding layer interposed between two layers of materials which are to be bonded together. The use of a bonding layer is of particular advantage when it is difficult to achieve direct bonding of certain semiconductor materials to a layer. Such bonding layers can comprise, for example, a layer of oxide or a layer of silicon. When the bonding layer is brought into contact with a surface of the support substrate the properties of the bonding layer permit good quality bonding to be achieved.

In order to carry out indirect bonding, advantage may be taken of the good bonding properties of (1) a layer of silicon on a layer of the oxide $SiO_2$ on the surface of a support substrate, (2) a layer of oxide on a layer of the oxide SiO2 on the surface of a support substrate, or (3) a silicon support substrate.

When performing indirect bonding of a layer of SiGe to a support substrate; the surface of which may, for example, be formed from silicon or $SiO_2$, a layer of oxide may be created directly on a layer of SiGe by oxidizing the SiGe layer. However, during oxidation of the SiGe layer, the germanium present in the layer is pushed into regions thereof which are distant from the oxide layer being formed. Thus, germanium is observed to be segregated at the SiGe/oxide interface. Also, a zone is formed opposite the oxide in which the overall concentration of germanium increases. Thus, the concentration of germanium is no longer uniform through the SiGe layer.

Although this germanium segregation phenomenon may be minimized, particularly by carrying out the oxidation at low temperatures, the oxide formed is thermally unstable. Thus, this technique cannot be used when forming a good quality SGOI structure.

Alternatively, instead of oxidizing a layer of SiGe to obtain a bonding layer, a further known method of indirect bonding includes directly depositing a layer of oxide onto a layer of SiGe. The deposited oxide layer must then be polished prior to bonding to a silicon support substrate. However, when employing this technique, the oxide layer deposited on the SiGe layer then constitutes the buried oxide layer of the SGOI structure obtained, which can be disadvantageous. The density of that oxide layer and its electrical performance may prove to be insufficient for producing an oxide/semiconductor interface that satisfies the durability/force specifications in the semiconductor industry, particularly compared with the density and performance of a thermal oxide. Moreover, the use of a deposited oxide can also result in poor homogeneity of the thickness of the buried oxide layer in the SGOI structure, which can also be undesirable. Further, depositing the oxide layer may also cause contamination resulting in electrical defects.

Another technique for indirectly bonding a layer includes epitaxially growing a layer of strained silicon on the surface of a layer of SiGe. That silicon layer is subsequently completely oxidized to form a layer of silicon oxide ($SiO_2$), which permits oxide/oxide bonding with an oxidized silicon support substrate. Thus, total oxidation of the silicon layer epitaxially grown on the SiGe layer effectively causes the formation of an oxide layer on the surface of the structure to be bonded.

However, stopping the oxidation front of that epitaxially grown silicon layer exactly at the interface between the epitaxially grown silicon layer and the SiGe layer is difficult to attain. The oxidation front is thus generally stopped after the Si/SiGe interface. This is termed "overoxidation." In such a case, SiGe is oxidized and the composite oxide SiyGetO2 is then formed, where y and t represent the respective concentrations of silicon and germanium in the composite oxide. Even more disadvantageously, the oxide/SiGe interface can then be susceptible of trapping charge carriers. While such a technique allows good oxide/oxide bonding, the effects of difficulty of controlling the oxidation front, coupled with a poor quality oxide/SiGe interface in the case of overoxidation, are not desirable.

Thus, there still remains a need in the art for a more effective technique for bonding a layer such as a Silicon-Germanium layer to a substrate. This need is now met by the present invention.

SUMMARY OF THE INVENTION

The purpose and advantages of the present invention will be set forth in and apparent from the description that follows, as well as will be learned by practice of the invention. Additional advantages of the invention will be realized and attained by the methods particularly pointed out in the written description and claims hereof, as well as from the appended drawings.

To achieve these and other advantages and in accordance with the purpose of the invention, as embodied and broadly described, the invention includes a method of producing a structure having a thin layer of semiconductor material on a support substrate, with the thin layer being obtained by transfer from a donor substrate having an upper layer of semiconductor material. This method comprises providing a bonding layer on the upper layer of the donor substrate, the bonding layer comprising a material configured to accept diffusion of an element from the semiconductor material of the upper layer; bonding the support substrate to the bonding layer of the donor substrate; and diffusing the element from the semiconductor material of the upper layer into the bonding layer to modify its properties.

BRIEF DESCRIPTION OF THE DRAWINGS

Further characteristics, aims and advantages of the invention become apparent from the following detailed description, made with reference to the accompanying drawings given by way of non-limiting examples and in which.

DETAILED DESCRIPTION OF THE PREFERRED EMBODIMENTS

Figure 1A:
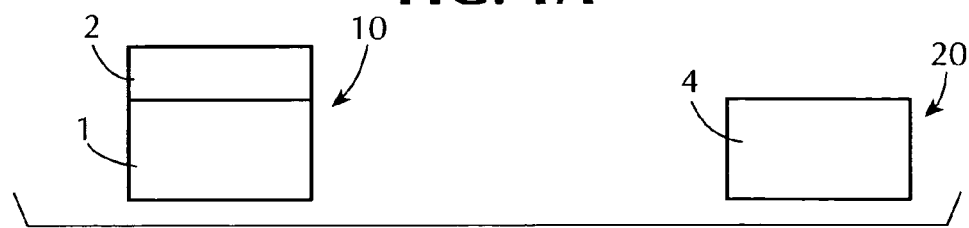
FIGS. 1a to 1e are diagrams showing the various steps of the method of the invention.

One non-limiting application of the invention relates to the production of a SOI structure by indirect bonding of a layer of semiconductor material to a layer of thermal oxide present on the surface of a support substrate.

More specifically, in one particular aspect, the invention aims to enable indirect bonding of a layer of semiconductor material to a support substrate via a bonding layer, which bonding to the support substrate is properly controlled, without recourse to total oxidation of the bonding layer, thereby overcoming the problem of stopping the oxidation front.

To this end, the invention provides a method of producing a structure comprising a thin layer of semiconductor material on a support substrate, the thin layer being obtained from a donor substrate comprising an upper layer of semiconductor material. The method includes the steps of forming a bonding layer of a material that accepts diffusion of an element of the material of the upper layer on the upper layer, bonding the donor substrate to the support substrate from the side on which the bonding layer is formed on the upper layer, and diffusing the element from the upper layer into the bonding layer to homogenize the concentration of the element in the bonding layer and the upper layer, to constitute the thin layer of the structure from the bonding layer and the upper layer.

During the diffusion step, the bonding layer can disappear by blending it into the upper layer to form the thin layer of the structure. Following bonding and prior to diffusion, the method can also include a thinning step directed at removing a portion of the donor substrate to retain only a portion of its upper layer, so as to obtain an intermediate structure comprising the support substrate, the bonding layer and a thin layer formed by the remainder of the upper layer. Thinning can be carried out by detachment from the donor substrate at a zone of weakness formed prior to bonding in the thickness of the upper layer. The zone of weakness can be formed by implanting species into the upper layer. A protective layer can be deposited on the bonding layer prior to implantation, where the protective layer is removed prior to bonding. The thinning step can include at least one etching step.

The diffusion step can be carried out by applying a heat treatment to the intermediate structure obtained after thinning. The diffusion step can be carried out during a heat treatment for stabilizing the bonding interface of the structure obtained after thinning. Specifically, the heat treatment can be carried out between 1000° C. and 1100° C. for about two hours. When the upper layer is SiGe, the diffusion step can include diffusing the element Ge from the upper layer into the bonding layer.

The step of depositing the bonding layer can include depositing a film of strained silicon (Si) on the SiGe upper layer. The strained silicon film can be deposited by epitaxial growth. The thickness of the epitaxially grown strained silicon film is preferably about 5 nanometers (nm).

Bonding can be carried out on an oxidized support substrate to form a good quality Si/oxide bond. Following formation of the strained monocrystalline silicon film and prior to bonding, a partial thermal oxidation step can be carried out to form a layer of thermal oxide on the surface of the strained silicon film. Bonding can be carried out directly on an oxidized support substrate to produce a good quality oxide/oxide bond. Bonding can also be carried out directly onto a silicon support substrate to produce a good quality oxide/Si bond.

The step of forming the bonding layer can also include forming, on the SiGe upper layer, a film of SiGe with a germanium concentration such that direct bonding of the SiGe film to a layer of oxide may be carried out. The concentration of germanium in the SiGe film can be, for example, less than 20%. Similarly, bonding can be carried out directly to an oxidized support substrate so that a good quality SiGe/oxide bond is produced.

Prior to bonding, the surfaces to be bonded can be treated to produce mutual hydrophilic bonding of the surfaces.

During the diffusion step, germanium diffuses into the bonding layer so that a layer with a homogeneous concentration of germanium is obtained by assimilation of the bonding layer with the SiGe upper layer. Optionally, the germanium diffuses at least into the non-oxidized portion of the bonding layer when a step of partially oxidizing the bonding layer has been carried out prior to bonding.

The invention also provides a method of bonding together a first wafer and a second wafer of semiconductor material, where the first wafer includes an upper layer and the second wafer has a free face. The method includes forming a bonding layer of a material that accepts diffusion of an element of the material of the upper layer on the upper layer of the first wafer, bonding the upper layer of the first wafer to the free face of the second wafer; and diffusing the element of the upper layer into the bonding layer to homogenize the concentration of the element in the bonding layer and the upper layer. The bonding layer preferably disappears by blending with the upper layer so that the wafers are bonded together and the upper layer of the first wafer is connected to the free face of the second wafer.

In accordance with a further aspect of the invention, a method of producing a SOI structure is provided by indirectly bonding a layer of semiconductor material to a layer of thermal oxide present on the surface of a support substrate.

It is to be understood that both the foregoing general description and the following detailed description are exemplary and are intended to provide further explanation of the claimed invention.

Reference will now be made in detail to the present preferred embodiments of the invention, an example of which is illustrated in the accompanying drawing. The invention relates in general to bonding an upper layer formed on a donor substrate onto a substrate support. More particularly, the invention relates to an upper layer formed from a material which cannot be bonded directly onto the support substrate. Bonding is thus carried out indirectly via a bonding layer which is formed on the upper layer.

In general, the bonding layer used in the context of the invention is a layer of a material (1) for which bonding to the support substrate is mastered, and (2) which accepts diffusion of an element of the material composing the upper layer.

For purposes of illustration and not limitation, FIGS. 1a–1e are diagrams showing the various steps in the method of the invention. Referring to FIG. 1a, a donor substrate 10 is provided which includes a lower layer 1 and an upper layer 2. The upper layer 2 is typically formed from a semiconductor material which cannot be directly bonded in a satisfactory manner to a free surface 4 of a support substrate 20.

Figure 1B:
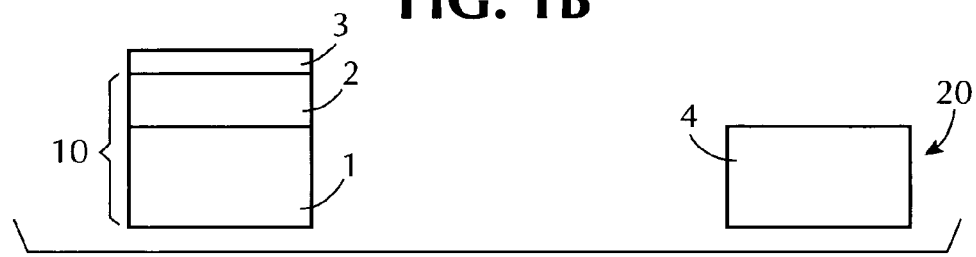

With reference to FIG. 1b, as embodied herein, the method of the invention includes forming, on the upper layer 2 of the donor substrate 10, a bonding layer 3 with the characteristics mentioned above.

Figure 1C:
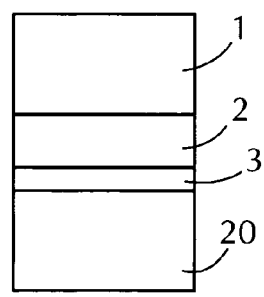

Referring to FIG. 1c, the method of the invention further includes the step of bonding the structure including the donor substrate 10 and the bonding layer 3 to the support substrate 20, wherein the bonding layer 3 is brought into intimate contact with the free face 4 of the support substrate 20. Prior to bonding, it is also possible to carry out a treatment (for example a hydrophilic treatment) of the surfaces to be bonded together (bonding layer 3 and free face 4) to ensure good bonding adhesion.

Figure 1D:
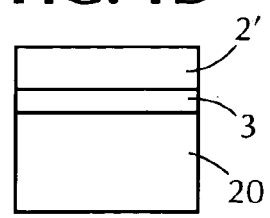
Figure 1E:
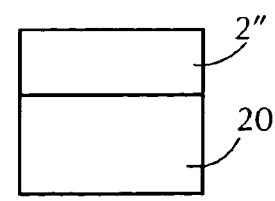

Referring to FIGS. 1c and 1d, the method of the invention can optionally include a thinning step to remove a portion of the donor substrate 10 to retain only a portion of its upper layer 2 and thus obtain an intermediate structure that comprises the remainder of the upper layer (e.g., layer 2' in the same material as the upper layer 2), the bonding layer 3 and the support substrate 20.

The method of the invention also includes a step directed at diffusing into the bonding layer 3 an element of the material of the layer 2' to cause the bonding layer 3 to disappear by assimilating it with the thin layer. This results in the formation of a homogeneous thin layer 2" on the surface of the support substrate 20. As is evident, the material of the thin layer 2" is derived from the materials of the layer 2' and the bonding layer 3. Moreover, because of the diffusion that has occurred between the material of the layer 2' and that of the bonding layer 3, the two layers constitute a single thin layer 2" the material of which is homogeneous. The thickness of the bonding layer 3 is preferably adjusted to allow it to reduce to a sufficient extent to cause the bonding layer 3 to "disappear" into the layer 2', thus forming thin layer 2".

As a result, a structure is obtained which comprises the thin layer 2" on the donor substrate 20. The characteristics of the material of the thin layer 2" resemble those of the material of the upper layer 2 of the starting donor substrate 10. The bonding layer 3 used has thus disappeared and no longer contributes to the final structure.

In accordance with an aspect of the invention, a method is provided that permits bonding any structure including a SiGe upper layer onto a support substrate (for example made of silicon).

A structure comprising a SiGe upper layer may be provided with an upper layer of strained SiGe. In accordance with this aspect of the invention, a donor substrate can be used that includes a wafer of monocrystalline silicon and a SiGe upper layer, the SiGe upper layer being strained by the subjacent silicon wafer. It should be noted that in such a case, a bonding layer of silicon formed on the upper layer of strained SiGe has the same lattice parameter as the silicon wafer and is thus not strained.

A structure including a SiGe upper layer can also have an upper layer of relaxed SiGe. In accordance with this aspect of the invention, a donor substrate including, for example, a wafer of monocrystalline silicon is used on which the upper layer of relaxed SiGe is produced via a buffer layer in which the lattice parameter changes despite the difference in lattice parameters existing between the two materials, silicon and SiGe. The buffer layer interposed between the silicon wafer and the layer of relaxed SiGe is generally formed from SiGe, with a proportion of germanium that progressively increases in quantity from the silicon wafer towards the upper layer of relaxed SiGe.

A structure can also be provided having a layer of SiGe on which a film of silicon has been grown, a relatively thin layer of SiGe being on the surface of the silicon film. In particular, the film of silicon constitutes an etch-stop layer when carrying out selective etching of SiGe over Si. The invention also encompasses more complex structures having a SiGe upper layer and one or more etch-stop layers.

The silicon support substrate can include at the surface a layer of silicon oxide $SiO_2$ obtained by thermal oxidation of the silicon support substrate. In accordance with this aspect of the invention, the bonding layer can be a layer of silicon. The layer of silicon is preferably formed from monocrystalline silicon, but may also be formed from polycrystalline or amorphous silicon.

Prior to bonding, partial oxidation of the silicon layer can be carried out to form a layer of thermal oxide on the surface of the silicon layer. Accordingly, the layer of oxide $SiO_2$ formed by oxidation of the silicon layer acts as the bonding layer. Since oxidation is only partial, it should be noted that the oxidation front can be stopped before it reaches the SiGe layer subjacent to the bonding layer, which overcomes the limitations mentioned above.

Thus, advantage can be taken of the bonding properties of (1) a silicon bonding layer on a layer of $SiO_2$ on the surface of a silicon support substrate (if the silicon support substrate is oxidized), (2) a bonding layer formed from $SiO_2$ on a layer of SiO2 on the surface of a silicon support substrate (if the silicon support substrate is oxidized) and (3) a bonding layer of $SiO_2$ on a silicon support substrate (if the silicon support substrate is not oxidized).

In accordance with another embodiment of the invention, the bonding layer can be a layer of silicon-germanium with a germanium concentration such that bonding it (for example hydrophilic) to an oxidized silicon substrate is possible (i.e. as mentioned above, for example, an SiGe layer with a low concentration of germanium, typically less than 20%).

FIGS. 2a to 2f show an example of the invention for indirect bonding of a layer of relaxed SiGe to a support substrate of oxidized silicon and the production of a SGOI structure. More particularly, this embodiment of the invention is carried out within the context of a SMARTCUT® type transfer method. Further details regarding the SMART-CUT® method can be found in the document "Silicon-on-Insulator Technology: Materials to VLSI, 2nd Edition" by Jean-Pierre Colinge, Kluwer Academic Publishers, pp 50 and 51.

Figure 2A:
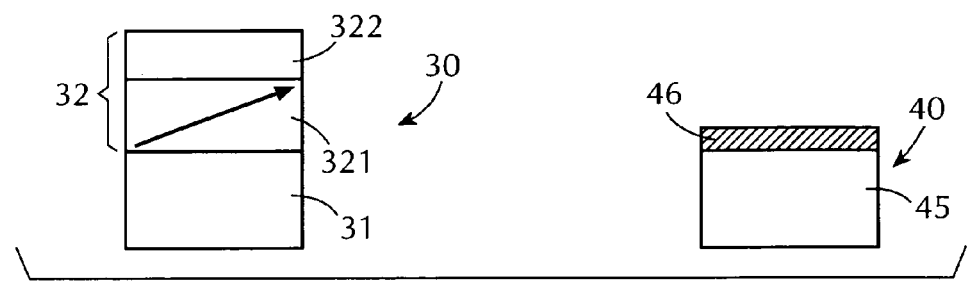
FIGS. 2a to 2f show an implementation of the method of the invention in the context of a SMARTCUT® type transfer method of indirect bonding of a layer of relaxed SiGe to an oxidized silicon support substrate and producing a SGOI structure.

Referring to FIG. 2a, a donor substrate 30 includes a wafer of monocrystalline silicon 31 on which an upper layer of relaxed SiGe 322 has been formed via the intermediary of a buffer layer 321. The layer of relaxed SiGe 322 is advantageously formed by epitaxial growth on the surface of the buffer layer 321. The thickness of layer 322 can vary widely depending on circumstances; but is typically in the range 0.5 microns (μm) to 1 μm. In FIG. 2a, reference number 32 designates the assembly constituted by the buffer layer 321 and the layer of relaxed SiGe 322.

A support substrate 40 formed from oxidized silicon is also shown in FIG. 2a. It comprises a wafer of silicon 45, a layer of thermal oxide 46, and a free surface 44 (on the side of the layer of oxide 46) onto which the upper layer 322 of the donor substrate 30 is to be bonded.

Figure 2B:
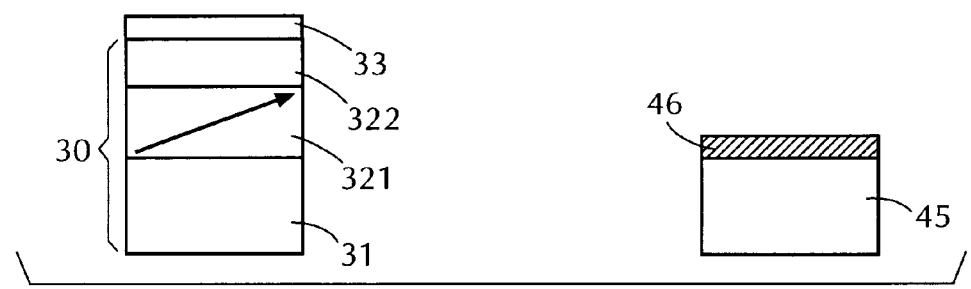

Referring to FIG. 2b, a film of strained monocrystalline silicon 33 which will constitute a bonding layer is grown on the upper layer of relaxed SiGe 322. The silicon in film 33 is caused by the layer of relaxed SiGe to increase its nominal lattice parameter to render it substantially identical to that of its growth substrate, and thus has internal tensile stresses. The film 33 of strained monocrystalline silicon is advantageously formed by epitaxial growth using known techniques such as CVD and MBE (chemical vapor deposition and molecular beam epitaxy respectively). Epitaxial growth of the monocrystalline strained bonding layer 33 can be carried out (1) in situ, directly by continuing the formation of the subjacent layer of SiGe 322; or by (2) following a light step of surface finishing the subjacent layer of SiGe, for example by CMP (chemical-mechanical polishing).

The thickness of the silicon film 33 is quite low, below a critical thickness, so that there is no relaxation within the thickness of the film 33 of the strain imposed by the layer 322 of relaxed SiGe towards the nominal lattice parameter of silicon and/or a generation of defects in the film 33. The critical thickness depends on the concentration of germanium in the layer of SiGe which imposes the strain. Put simply, the higher the concentration, the lower the critical thickness.

The thickness of the silicon film is also selected in a manner so that the bonding layer which will be constituted from the film 33 can disappear after bonding, as will be described in more detail below, by diffusion of germanium within its thickness, it being assimilated and homogenized with SiGe layer 322. Moreover, the strain imposed on the film 33 is a factor that encourages diffusion of germanium into the bonding layer, for homogenization with the layer of SiGe 322.

The aim of the bonding disclosed by T. A. Langdo et al mentioned above is different, however, from that of the invention in that it relates to the production of a strained silicon on insulator structure (sSOI), the strain in the silicon layer being ensured by the subjacent relaxed layer of SiGe. Langdo et al. do not teach the production of a SGOI structure and a fortiori does not propose any solutions for bonding a layer of relaxed SiGe to an oxidized support substrate and does not envisage the diffusion of germanium from the layer of relaxed SiGe into the layer of strained Si. Moreover, in Langdo et al. the layer of strained silicon that is transferred is deliberately thick so that it can be preserved and constitute the active electrical layer of the final sSOI structure. This thickness is too great when compared with the constraints imposed by the invention for the layer of strained silicon to disappear, as will be described in more detail below, by diffusion of germanium into its thickness, assimilating it and homogenizing it with the SiGe layer.

Considering a layer of SiGe 322 with a germanium concentration of the order of 20%, the thickness of the film 33 must typically be less than 20 nm to prevent the silicon lattice from relaxing. The strained film 33 is preferably about 5 nm thick to allow its complete assimilation by SiGe layer 322 arising from diffusion of the germanium contained therein into layer 33.

Alternatively, it is possible to deposit a layer of polycrystalline or amorphous silicon on the SiGe upper layer 322 rather than a film of strained monocrystalline Si. Accordingly, little or no strain is observed in the silicon layer. Thus, it is possible to deposit a layer of polycrystalline or amorphous silicon of the desired thickness with no limitations as regards its thickness, in particular when partial oxidation of the silicon layer is envisaged prior to bonding.

Figure 2C:
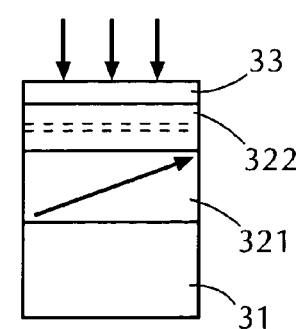

Referring to FIG. 2c, atomic or ionic species are implanted in a manner that is known, through the film of monocrystalline silicon 33, into the SiGe upper layer 322, to create a zone of weakness (shown as a dotted line) in the thickness of the SiGe upper layer 322.

In a particular implementation of the invention, prior to the implantation step, a step is carried out to deposit a protective layer on the bonding layer. The protective layer can protect the surface of the bonding later, in particular from the effects of implantation. Specifically, deposition of the protective layer is advantageous when the bonding layer does not include an upper layer of oxide (the upper layer of oxide being obtained, for example, by partial oxidation of the bonding layer, as is the case of the alternatives described below). The protective layer is generally removed prior to bonding the donor structure to the support substrate.

Figure 2D:
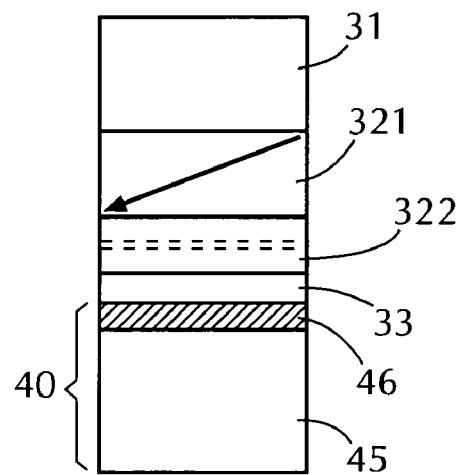

With reference to FIG. 2d, the implanted donor structure including a film of silicon 33 at the surface is brought into intimate contact with the free surface 44 of the oxidized support substrate 40 to produce a good Si/oxide bond. Optionally, the surface of the silicon film 33 and the free surface 44 can be prepared prior to bonding to render them hydrophilic and to reinforce the adhesion of the bond of the donor substrate with the support substrate 40 of oxidized silicon.

A number of variations of the inventive method are also possible.

In a first alternative, the strained silicon film 33 can be partially oxidized prior to bonding to form a layer of thermal oxide in the superficial region of the film 33. This layer of oxide is then used as a bonding layer to produce a bond on an oxidized support substrate. In a second alternative, wherein the strained silicon film 33 is partially oxidized, the layer of thermal oxide that is formed is then used as a bonding layer to bond directly to a silicon support substrate and it then constitutes the buried oxide layer of the final SGOI structure. It should be noted that these two alternatives can also be implemented when the bonding layer is formed from polycrystalline or amorphous silicon.

In accordance with a further aspect of the invention, following the indirect bonding step, a step of thinning the donor substrate can be carried out to remove a portion of the donor substrate and retain only a portion (and in particular a portion of the upper layer 322 of SiGe which will constitute the useful layer of the final structure). This thinning step can be performed, for example, by employing a SMART-CUT® type transfer method.

Figure 2E:
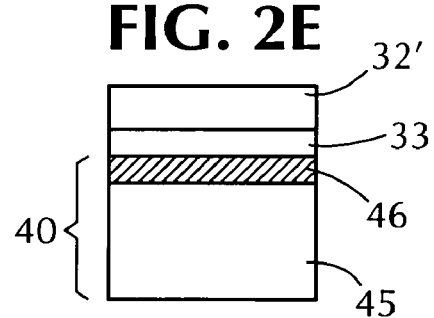

Referring to FIG. 2e, following the thinning step, a portion of the donor substrate is transferred to the support substrate, retaining only that part of the donor substrate that is the portion of the SiGe upper layer 322 on the side of the silicon film 33 with respect to the implantation zone. An intermediate structure is then obtained comprising the oxidized support substrate 40, the silicon film 33 and a thin layer 32' formed from SiGe corresponding to the portion derived from the upper layer 322.

Figure 2F:
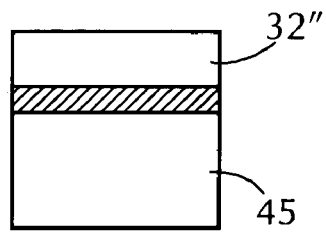

Following the thinning step and referring to FIG. 2f, a step is performed including diffusing germanium from the thin layer 32' of SiGe into the bonding layer (in this case the film of strained monocrystalline silicon 33). The strain which is imposed on the film 33 by the SiGe layer encourages the diffusion of germanium through the film 33, the lattice parameters of the film 33 and the SiGe layer being substantially identical.

This diffusion step can thus (1) cause the silicon layer 33 to disappear by assimilating it with the SiGe layer 32', and (2) obtain an SiGe layer 32" with a homogeneous germanium concentration. Notably, the concentration of germanium in the SiGe layer 32" is almost unchanged compared with that previously present in the SiGe layer 32', in particular because of the ratio between the thicknesses of the SiGe layer 32' and the bonding layer (note that the thicknesses of the layers shown in the Figures are not to scale).

The diffusion step includes heat treatment for the structure obtained after bonding and thinning carried out, for example, between 1000° C. and 1100° C. for about two hours. The heat treatment can advantageously be carried out during conventional stabilization steps, in particular in the context of SMARTCUT® type transfer methods, to reinforce the interface between the thin layer and the support substrate.

The method thus provides a SGOI structure composed of a wafer of silicon 45, a buried oxide layer 46 and a thin SiGe layer 32" which benefits from a good bond quality between SiGe layer 32" and oxide layer 46. The quality of the buried oxide is that of a thermal oxide. Whatever the variation employed, the buried oxide is obtained by thermal oxidation of the silicon substrate 45 and/or by partial thermal oxidation of the silicon film 33.

Prior art oxide on SiGe deposition techniques necessitate polishing the deposited oxide layer prior to bonding, which can cause a lack of homogeneity in the thickness. The invention permits bonding which does not necessitate a prior polishing step of at least one of the surfaces that are brought into contact. Thus, the buried oxide layer possesses good uniformity in thickness.

The invention is not limited to the structure comprising a buffer layer that is presented here, but can also in particular be applied to any structure comprising an SiGe upper layer. Moreover, the material of the bonding layer is not limited to silicon. As already mentioned above regarding the second implementation of the invention, when bonding to an oxidized support substrate, the material of the bonding layer can be SiGe. Specifically, an SiGe bonding layer is used with a germanium content (typically less than 20%) so that bonding of the SiGe layer to a layer of oxide SiO2 can be carried out in a satisfactory manner.

The use of such a bonding layer of SiGe with a low germanium content thus permits a layer of SiGe having a germanium content that is too high to be able to be directly bonded to an oxidized support substrate. When an Si1-xGex bonding layer with a low concentration, x, of Ge is used for indirect bonding of an upper layer of Si1-yGey with a concentration, y, of germanium that is higher (y>x), the Si1-xGex bonding layer is strained by the Si1-yGey upper layer. In a manner that is similar to that described above regarding a bonding layer constituted from a strained monocrystalline silicon film, the strain imposed on the Si1-xGex bonding layer is a factor that encourages the diffusion of germanium through the bonding layer, for its homogenization with the Si1-yGey upper layer.

As with the silicon bonding layer described above, the thickness of the Si1-xGex bonding layer is selected so that there is no relaxation of the strain throughout its thickness such that the bonding layer can disappear after bonding by diffusion of germanium through its thickness.

Also, the steps for implanting and detaching at a zone of weakness described above are only mentioned as examples of steps that can bring about thinning, on the donor substrate side, of the structure obtained after bonding.

Other examples of thinning techniques are also possible. These examples in no way limiting, and the invention encompasses any type of technique that can thin the donor substrate in accordance with the method of the invention. One such thinning technique can include removing material by supplying energy to "cut" the donor substrate at a zone which has been weakened by creating at least one porous layer. Other techniques can include mechanical or chemical-mechanical detachment by lapping and/or chemical-mechanical polishing, CMP. Dry etching techniques such as plasma or spray etching can also be employed.

Also, selective chemical etching techniques can be carried out, in particular when the structure to be etched includes etch-stop layers. This is particularly applicable with a donor substrate including a silicon etch-stop layer subjacent to an SiGe upper layer in which the silicon etch-stop layer can be used to thin the donor substrate, following bonding by selective etching.

Finally, the invention does not only relate to the indirect bonding of an SiGe layer, but also relates to indirect bonding of any layer of semiconductor material that can be transferred to a support substrate via the intermediary of a bonding layer using the method of the invention.

It will be apparent to those skilled in the art that other various modifications and variations can be made in the method of the present invention without departing from the spirit or scope of the invention. Thus, it is intended that the present invention include modifications and variations that are within the scope of the appended claims and their equivalents.

What is claimed is:

1. A method of producing a structure having a thin layer of semiconductor material on a support substrate, with the thin layer being obtained by transfer from a donor substrate having an upper layer of semiconductor material, wherein the method comprises:
   providing a bonding layer on the upper layer of the donor substrate, the bonding layer comprising a material configured to accept diffusion of an element from the semiconductor material of the upper layer;
   treating the bonding layer to render it hydrophilic prior to bonding,
   bonding the support substrate to the bonding layer of the donor substrate; and
   diffusing the element from the semiconductor material of the upper layer into the bonding layer to modify its properties.

2. The method of claim 1, wherein the diffusing of the element into the bonding layer is conducted to homogenize the element in upper and bonding layers, causing the bonding layer to disappear and forming a layer having a concentration of the element that is essentially the same as that of the upper layer.

3. The method of claim 2, which further comprises removing a portion of the donor substrate to provide the thin layer on the support substrate.

4. The method of claim 3, wherein the portion of the donor substrate is removed by detaching the donor substrate at a zone of weakness formed in the upper layer prior to bonding.

5. The method of claim 4, wherein the zone of weakness is formed by implanting species into the upper layer.

6. The method of claim 5, which further comprises providing a protective layer on the bonding layer, with the protective layer being removed prior to bonding.

7. The method of claim 3, wherein the portion of the donor substrate is removed by etching.

8. The method of claim 1, wherein the diffusing of the element is provided by applying a heat treatment to the upper and bonding layers.

9. The method of claim 8, wherein the heat treatment is carried out at between 1000° C. and 1100° C. for about two hours.

10. The method of claim 1, wherein the upper layer is formed from silicon-germanium, and the element diffused from the upper layer into the bonding layer is germanium.

11. The method of claim 10, wherein the bonding layer is formed from silicon, and the thickness of the bonding layer is sufficient to ensure substantially no relaxation of the silicon.

12. The method of claim 10, wherein the bonding layer is provided by depositing a film of strained silicon on the upper layer.

13. The method of claim 12, wherein the bonding layer is provided by epitaxial growth of a film of strained monocrystalline silicon on the upper layer.

14. The method of claim 12, wherein the film is provided at a thickness of about 5 nm.

15. The method of claim 12, wherein the strained silicon layer is partially oxidized to form an oxide layer that enhances bonding.

16. The method of claim 15, wherein the upper layer includes germanium and the upper and bonding layers cooperate to form a layer having a homogeneous concentration of germanium resulting from the diffusion of germanium into the non-oxidized portion of the strained silicon film.

17. The method of claim 1, wherein the support substrate includes an oxide layer that bonds to the bonding layer.

18. The method of claim 17, wherein the bonding layer includes silicon-germanium and has a germanium concentration sufficient to permit direct bonding of the bonding layer to the oxide layer of the support substrate.

19. The method of claim 18, wherein the concentration of germanium in the bonding layer is less than 20%.

20. The method of claim 19, wherein germanium diffuses into the bonding layer during the diffusion step, and the upper layer and bonding layer collectively form a layer having a homogeneous concentration of germanium.

21. The method of claim 1, further comprising treating the support substrate and the bonding layer so that surfaces to be bonded are rendered hydrophilic prior to bonding.

* * * * *

UNITED STATES PATENT AND TRADEMARK OFFICE
CERTIFICATE OF CORRECTION

PATENT NO. : 7,078,353 B2
APPLICATION NO. : 10/753173
DATED : July 18, 2006
INVENTOR(S) : Daval et al.

It is certified that error appears in the above-identified patent and that said Letters Patent is hereby corrected as shown below:

Title Page:
Item [75] Inventors, change the first name of the four-named inventor from "Oliver" to --Olivier--.

Signed and Sealed this

Twelfth Day of September, 2006

JON W. DUDAS
*Director of the United States Patent and Trademark Office*